(12) United States Patent
Kando et al.

(10) Patent No.: US 7,623,009 B2
(45) Date of Patent: Nov. 24, 2009

(54) BOUNDARY ACOUSTIC WAVE FILTER DEVICE

(75) Inventors: Hajime Kando, Ritto (JP); Norihiko Nakahashi, Ishikawa-gun (JP); Teruhisa Shibahara, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 11/951,869

(22) Filed: Dec. 6, 2007

(65) Prior Publication Data

US 2008/0122557 A1    May 29, 2008

Related U.S. Application Data

(63) Continuation of application No. PCT/JP2006/310465, filed on May 25, 2006.

(30) Foreign Application Priority Data

Jul. 13, 2005    (JP)    ............... 2005-204757

(51) Int. Cl.
    *H03H 9/64*    (2006.01)
(52) U.S. Cl. .................. 333/193; 333/195; 310/313 A
(58) Field of Classification Search .................. 333/193, 333/195
    See application file for complete search history.

(56) References Cited

U.S. PATENT DOCUMENTS

| | | | |
|---|---|---|---|
| 5,521,453 A | 5/1996 | Yatsuda | |
| 6,556,100 B2 | 4/2003 | Takamine | |
| 6,891,450 B2 | 5/2005 | Nakamura et al. | |
| 7,012,480 B2 | 3/2006 | Nakamura et al. | |
| 2006/0071579 A1 | 4/2006 | Kando | |
| 2007/0090898 A1 | 4/2007 | Kando | |

FOREIGN PATENT DOCUMENTS

EP    0664610 A1    7/1995

(Continued)

OTHER PUBLICATIONS

Official communication issued in the International Application No. PCT/JP2006/310465, mailed on Aug. 29, 2006.

(Continued)

*Primary Examiner*—Barbara Summons
(74) *Attorney, Agent, or Firm*—Keating & Bennett, LLP (57) ABSTRACT

A boundary acoustic wave filter device capable of increasing an out-of-band attenuation includes a dielectric film formed on a piezoelectric substrate, at least one longitudinally coupled resonator boundary acoustic wave filter having a plurality of IDTs disposed along a boundary between the piezoelectric substrate and the dielectric film, and at least two one-terminal-pair boundary acoustic wave resonators. At least one boundary acoustic wave resonator is connected in series to the longitudinally coupled resonator boundary acoustic wave filter, and at least remaining one boundary acoustic wave resonator is connected in parallel to the longitudinally coupled resonator boundary acoustic wave filter. An anti-resonant frequency of the serially connected boundary acoustic wave resonator is located in a higher frequency range than a passband of the boundary acoustic wave filter device, and a resonant frequency of the parallel-connected boundary acoustic wave resonator is equal to or higher than the anti-resonant frequency of the serially connected boundary acoustic wave resonator.

3 Claims, 3 Drawing Sheets

FOREIGN PATENT DOCUMENTS

| | | | |
|---|---|---|---|
| EP | 1 696 562 A | | 8/2006 |
| JP | 2002-064358 A | | 2/2002 |
| JP | 2002-111443 A | | 4/2002 |
| JP | 2004-048283 A | | 2/2004 |
| JP | 2005-176254 A | | 6/2005 |
| WO | WO 2004/070946 | * | 8/2004 |
| WO | 2005/060094 A | | 6/2005 |

OTHER PUBLICATIONS

Official Communication issued in corresponding European Patent Application No. 06746844.7, mailed on Jul. 10, 2009.

Kiselev et al., "Saw Filters with Combined Single-Mode and Double-Mode Sections," 2002 IEEE Ultrasonics Symposium, vol. 1, Oct. 11, 2002, pp. 179-183.

* cited by examiner

PRIOR ART

FIG. 5

BOUNDARY ACOUSTIC WAVE FILTER DEVICE

BACKGROUND OF THE INVENTION

1. Field of the Invention

The present invention relates to a boundary acoustic wave filter device utilizing a boundary acoustic wave propagating along a boundary surface between a piezoelectric substrate and a dielectric film, and more particularly, the present invention relates to a boundary acoustic wave filter device having a circuit configuration in which a one-terminal-pair boundary acoustic wave resonator is connected to a longitudinally coupled resonator boundary acoustic wave filter.

2. Description of the Related Art

Recently, surface acoustic wave filter devices have been used as bandpass filters in RF stages of mobile phones because of their smaller size and excellent filter characteristics.

For example, in Japanese Unexamined Patent Application Publication No. 2002-64358, a compound surface acoustic wave filter device in which a one-port-type surface acoustic wave resonator is connected in series to a longitudinally coupled resonator double-mode surface acoustic wave filter is disclosed.

Figure 5:
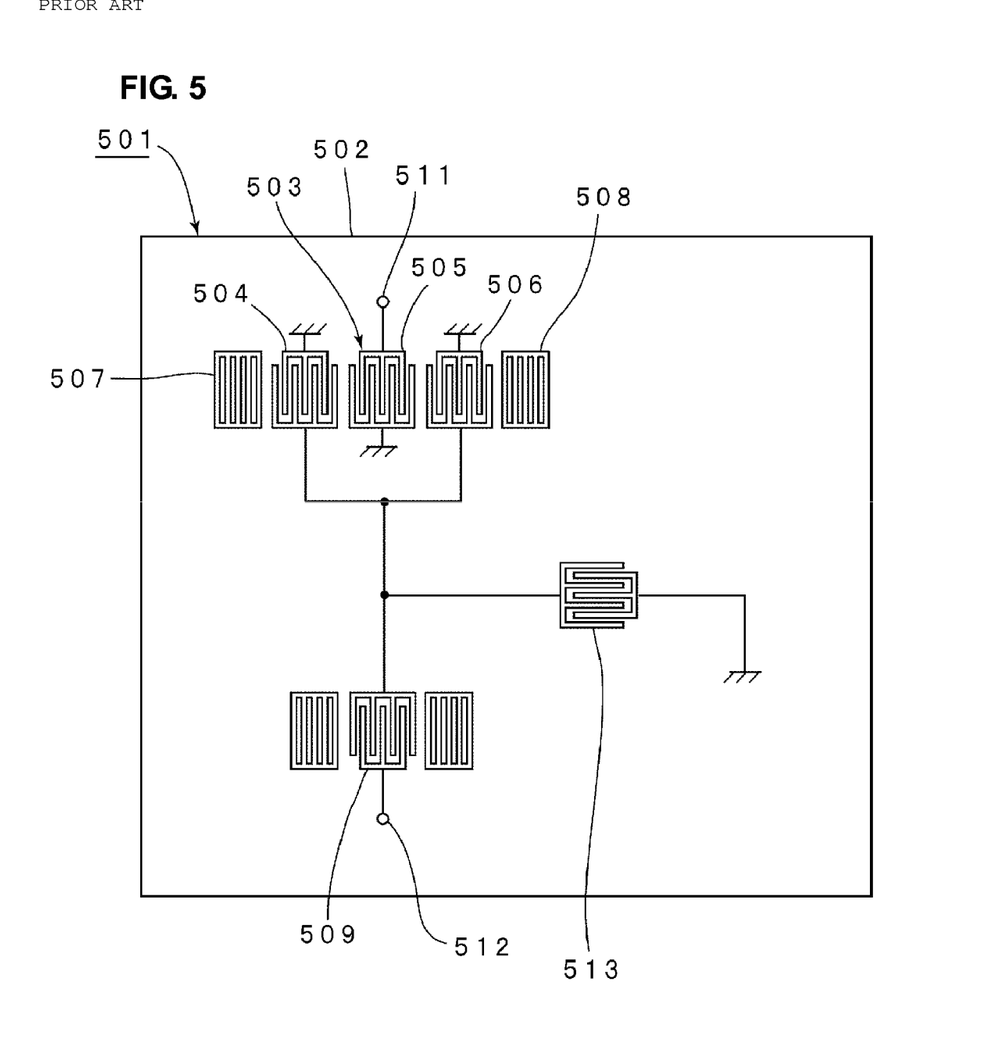
FIG. 5 is a schematic plan view of an example of the electrode configuration of the boundary acoustic wave filter device in the related art.

FIG. 5 is a schematic plan view of the schematic configuration of this type of compound surface acoustic wave filter device. A compound surface acoustic wave filter device 501 implements an electrode configuration shown in the drawing on a piezoelectric substrate 502. That is, IDTs 504 to 506 are arranged in the propagation direction of a surface-acoustic wave. Reflectors 507 and 508 are each disposed on a corresponding side of a region in which the IDTs 504 to 506 are provided, in the propagation direction of the surface wave, whereby a longitudinally coupled resonator double-mode surface acoustic wave filter 503 is configured. One end of the IDT 505 is connected to an input terminal 511. The IDTs 504 and 506, each of which is disposed on a corresponding side, are commonly connected to each other and connected to a one-terminal-pair surface acoustic wave resonator 509. The one-terminal-pair surface acoustic wave resonator 509 is connected to an output terminal 512.

In the surface acoustic wave filter device 501, the one-terminal-pair surface acoustic wave resonator 509 is connected in series to the longitudinally coupled resonator double-mode surface acoustic wave filter 503, thereby increasing an out-of-band attenuation.

Furthermore, considering that it is difficult to obtain a sufficient attenuation by using only the above-described configuration, a capacitor 513 is connected to a path that connects the longitudinally coupled resonator double-mode surface acoustic wave filter 503 and the one-terminal-pair surface acoustic wave resonator 509 in series. That is, a path including the capacitor 513 serves as a bypass path, and signals in a stopband located in a higher frequency range than a passband flow to the ground potential. This improves attenuation in the high frequency range located outside of the passband.

In contrast, in Japanese Unexamined Patent Application Publication No. 7-131290 described below, a configuration with a parallel-connected resonant element instead of the capacitor 513 is disclosed. In a case where a resonator is used, a steep impedance change at a resonant frequency can be obtained. Accordingly, even when a low impedance peak is located outside of a passband in a low frequency range, impedance can be maintained to be high in the passband. As a result, attenuation in the low frequency range located outside of the passband can be sufficiently increased without causing any large effects on the passband. In Japanese Unexamined Patent Application Publication No. 7-131290, as described above, a resonant frequency of the parallel-connected resonator is located in a stopband that is located outside of the passband of the filter in the low frequency range, and an anti-resonant frequency of a serially connected resonator is located in a higher frequency range than the passband. That is, with this configuration, the parallel-connected resonator, which is used instead of the capacitor 513, improves the attenuation in the low frequency range located outside of the passband.

In the surface acoustic wave filter device 501, which is disclosed in Japanese Unexamined Patent Application Publication No. 2002-64358, as described above, the serially connected type one-terminal-pair surface acoustic wave resonator 509 is connected in series to the longitudinally coupled resonator double-mode surface acoustic wave filter 503, and the capacitor 513 is also connected in parallel to the serial path. This allows an out-of-band attenuation, in particular, attenuation in the high frequency range located outside of the passband to be increased.

In order to improve the attenuation in a stopband using a capacitive element such as the capacitor 513, it is necessary that the capacitive element has a low impedance to signals at frequencies in the attenuation in a stop band and a high impedance to signals at frequencies in a passband.

However, merely using the capacitor 513 does not cause a steep change in impedance. For this reason, when impedance in the stopband is set to be low in order to sufficiently increase attenuation in the vicinity of the passband, there is a disadvantage in that impedance in the passband does not become sufficiently high. In such a case, some of the signals in the passband flow to the capacitor 513, resulting in a deterioration in the characteristics of the passband. Conversely, when the impedance to the signals in the passband is set to be sufficiently high, there is a disadvantage in that the impedance in the stopband does not become sufficiently low, resulting in the attenuation in the stopband not being sufficiently increased.

In the surface acoustic wave filter device disclosed in Japanese Unexamined Patent Application Publication No. 7-131290, instead of the capacitor 513, the parallel-connected surface acoustic wave resonator is connected to the path. In this case, even when a resonance point, which is a low impedance peak, is located outside of the passband in the low frequency range, high impedance can be achieved in the passband. Accordingly, the attenuation in the low frequency range located outside of the passband can be increased without causing any large effects on the characteristics of the passband.

In the configuration disclosed in Japanese Unexamined Patent Application Publication No. 7-131290, the resonant frequency of the parallel-connected surface acoustic wave resonator is located in the stopband that is located outside of the passband of the filter in the low frequency range, and an anti-resonance point of the serially connected surface acoustic wave resonator is located outside of the passband in the high frequency range, whereby the parallel-connected-type surface acoustic wave resonator increases the attenuation in the low frequency range located outside of the passband. In order to increase attenuation in the high frequency range located outside of a passband, a resonance point of the parallel-connected surface acoustic wave resonator can be located in a higher frequency range than the passband of a filter. In this case, the impedance of the parallel-connected surface acoustic wave resonator is capacitive in the passband.

The larger the electromechanical coefficient of a surface acoustic wave filter, the less the capacitive IDTs with which the surface acoustic wave filter is configured seem to be. Accordingly, when the electromechanical coefficient is comparatively small, the IDTs seem to be capacitive. Thus, because all of the filter, the serially connected surface acoustic wave resonator, and the parallel-connected surface acoustic wave resonator seem to be capacitive, there is a disadvantage in that it is difficult to achieve impedance matching in the passband.

The electromechanical coefficient of the IDTs is represented by $K^2$, a capacity ratio of the IDTs is represented by $\gamma$. Because the equations $\gamma = C0m/Cm$ (C0m represents parallel capacitance when the IDTs are represented by an equivalent circuit, and Cm represents a capacitive element in a series-resonant circuit that represents a function of emitting a surface-acoustic wave) and $K^2 = 1/(1+\gamma)$ are obtained, the relationship $\gamma = (1/K^2) - 1$ can be achieved.

That is, the larger the electromechanical coefficient $K^2$, the smaller the capacity ratio $\gamma$. That is, C0m/Cm becomes small. In other words, when the electromechanical coefficient $K^2$ is small, the admittance of C0m seems to be large with respect to the admittance of the series circuit that emits a surface-acoustic wave. As a result, the IDTs in the surface acoustic wave filter seem to be capacitive. Conversely, when the electromechanical coefficient $K^2$ is large, the IDTs seem to be less conductive.

In the related art, in the surface acoustic wave filter device, because the electromechanical coefficient is comparatively small, the IDTs in the surface acoustic wave filter seem to be capacitive. In a case where the serially connected surface acoustic wave resonator and the parallel-connected surface acoustic wave resonator are connected to the surface acoustic wave filter and a resonance point of the parallel-connected surface acoustic wave resonator is located outside of the passband in a high frequency range, in addition to that, the original impedance is capacitive, the capacitive parallel-connected-type surface acoustic wave resonator is connected to the surface acoustic wave filter. Accordingly, there has been a disadvantage in that it is difficult to achieve impedance matching in the passband.

Thus, in the surface acoustic wave filter device in the related art, the parallel-connected surface acoustic wave resonator, which is connected in parallel to the surface acoustic wave filter, has not been used to improve the attenuation in the high frequency range located outside of the passband.

Recently, instead of a surface acoustic wave filter device, a boundary acoustic wave filter device in which a wave propagates along a boundary between different media has drawn attention. Because in a boundary acoustic wave filter device, no space needs to be provided, a packaging configuration can be more simplified and miniaturized. Furthermore, as in the case of a surface acoustic wave filter device, the improvement of an out-of-band attenuation has been strongly requested also in a boundary acoustic wave filter device.

SUMMARY OF THE INVENTION

In order to overcome the problems described above, preferred embodiments of the present invention provide a boundary acoustic wave filter device that has a circuit configuration in which a boundary acoustic wave resonator is connected to a boundary acoustic wave filter and that can sufficiently increase the attenuation in the high frequency range located outside of a passband.

According to a preferred embodiment of the present invention, a boundary acoustic-filter device includes a piezoelectric substrate, a dielectric film formed on the piezoelectric substrate, at least one longitudinally coupled resonator boundary acoustic wave filter having a plurality of IDTs disposed along a boundary between the piezoelectric substrate and the dielectric film, and at least two one-terminal-pair boundary acoustic wave resonators, each of which has an IDT located at the boundary between the piezoelectric substrate and the dielectric film. At least one of the one-terminal-pair boundary acoustic wave resonators defines a serially connected boundary acoustic wave resonator connected in series to the longitudinally coupled resonator boundary acoustic wave filter. At least a remaining one of the one-terminal-pair boundary acoustic wave resonators defines a parallel-connected boundary acoustic wave resonator connected in parallel to the longitudinally coupled resonator boundary acoustic wave filter. An anti-resonant frequency of the serially connected boundary acoustic wave resonator is located in a higher frequency range than a passband of the longitudinally coupled resonator boundary acoustic wave filter. A resonant frequency of the parallel-connected boundary acoustic wave resonator is equal to or higher than the anti-resonant frequency of the serially connected boundary acoustic wave resonator.

In a specific preferred embodiment of the boundary acoustic wave filter device according to the present invention, the piezoelectric substrate preferably is a single-crystal-LiNbO₃ substrate, and $\phi$ and $\theta$ of the Euler angles of the piezoelectric substrate are provided in a range of $-31° \leq \phi \leq 31°$ and in a range of $90° \leq \theta \leq 130°$, respectively.

In the boundary acoustic wave filter device according to various preferred embodiments of the present invention, preferably, the IDTs are formed of one type of metal selected from a group of Al, Ti, Pt, Fe, Ni, Cr, Cu, Ag, W, Ta, and Au, or an alloy mainly including the metal.

In another specific preferred embodiment of the boundary acoustic wave filter device according to the present invention, the dielectric film preferably is formed of one type of material selected from a group of SiO₂, SiN, crystal, LBO, langasite, langanite, and glass.

In the boundary acoustic wave filter device according to a preferred embodiment of the present invention, the at least one longitudinally coupled resonator boundary acoustic wave filter, and the at least two one-terminal-pair boundary acoustic wave resonators are formed using the piezoelectric substrate and the dielectric film. Accordingly, the packaging structure of the boundary acoustic wave filter device can be more simplified and miniaturized than that of a surface acoustic wave filter device.

Furthermore, at least one boundary acoustic wave resonator of the at least two one-terminal-pair boundary acoustic wave resonators defines a serially connected boundary acoustic wave resonator. At least remaining one boundary acoustic wave resonator defines a parallel-connected boundary acoustic wave resonator. The anti-resonant frequency of the serially connected boundary acoustic wave resonator is located in a higher frequency range than a passband of the longitudinally coupled resonator boundary acoustic wave filter. Accordingly, the serially connected boundary acoustic wave resonator can improve the attenuation in a high frequency range located outside of the passband of the filter. Additionally, because the electromechanical coefficient of the boundary acoustic wave filter is large, impedance becomes inductive. This enables the impedance matching of the entire filter device in the passband to be easily achieved.

Since the resonant frequency of the parallel-connected boundary acoustic wave resonator is equal to or higher than the anti-resonant frequency of the serially connected boundary acoustic wave resonator, the attenuation in the high frequency range located outside of the passband can be more efficiently improved using the impedance change in the vicinity of the resonant frequency of the parallel-connected boundary acoustic wave resonator. Accordingly, the attenuation in the high frequency range located outside of the passband can be more increased.

When the piezoelectric substrate is a single-crystal-LiNbO$_3$ substrate and when $\phi$ and $\theta$ of the Euler angles of the piezoelectric substrate are provided in a range of $-31° \leq \phi \leq 31°$ and in a range of $90° \leq \theta \leq 130°$, respectively, the electromechanical coefficient of the boundary acoustic wave filter can be more increased. This allows the impedance of the boundary acoustic wave filter to become more inductive, resulting in improving a state in which the impedance of the entire device in the passband is matched. Additionally, a power-flow angle can be reduced, and temperature characteristics can be improved.

When the IDTs are formed of one type of metal selected from a group of Al, Ti, Pt, Fe, Ni, Cr, Cu, Ag, W, Ta, and Au, or an alloy mainly including the metal, a boundary acoustic wave filter device with low loss can be provided.

When the dielectric film is formed of one type of material selected from a group of SiO$_2$, SiN, crystal, LBO, langasite, langanite, and glass, the characteristic change due to the temperature of the boundary acoustic wave filter device can be reduced.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference to the accompanying drawings.

Figure 1:
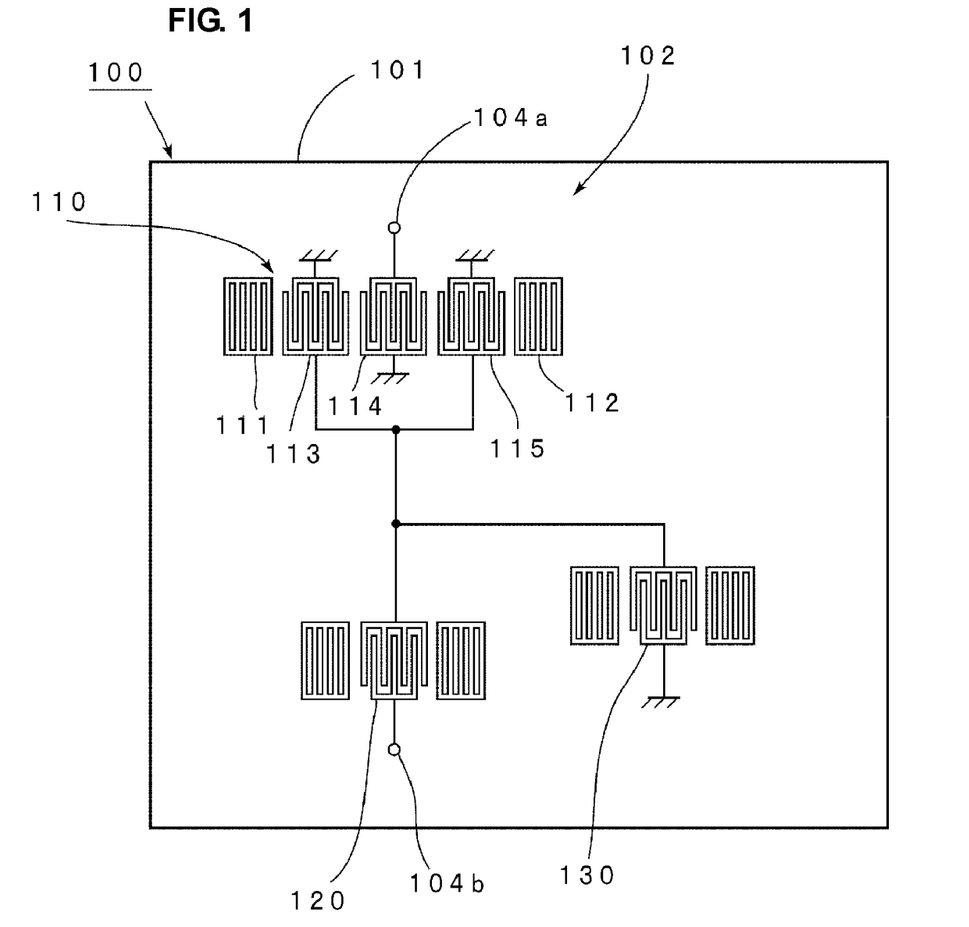
FIG. 1 is a schematic plan view of the electrode configuration of a boundary acoustic wave filter device according to a preferred embodiment of the present invention.
Figure 2:
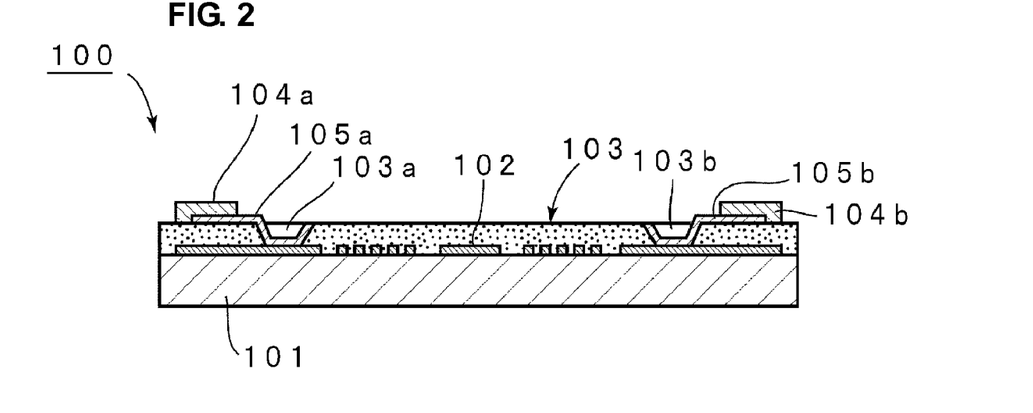
FIG. 2 is a schematic front-sectional view of a substantial portion of the boundary acoustic wave filter device according to a preferred embodiment of the present invention.

FIG. 1 is a schematic plan view of the electrode configuration of a boundary acoustic wave filter device according to a preferred embodiment of the present invention, and FIG. 2 is a schematic front-sectional view describing a substantial portion of the boundary acoustic wave filter device.

As shown in FIG. 2, the boundary acoustic wave filter device 100 according to the present preferred embodiment preferably includes a LiNbO$_3$ substrate 101 formed of a single crystal of LiNbO$_3$ as a piezoelectric substrate. A SiO$_2$ film 103 overlies the LiNbO$_3$ substrate 101 as a dielectric film. The boundary acoustic wave filter device 100 according to the present preferred embodiment utilizes an SH-type boundary acoustic wave propagating along a boundary surface between the LiNbO$_3$ substrate 101 and the SiO$_2$ film 103.

In FIG. 2, an electrode pattern 102 for passive excitation of the boundary acoustic wave is schematically shown. This electrode pattern 102, more specifically, corresponds to the electrode configuration shown in FIG. 1, which is the schematic plan view.

Dielectric-film openings 103a and 103b are formed on the SiO$_2$ film 103. Portions of the electrode pattern 102 are exposed through the dielectric-film openings 103a and 103b. Connection conductive portions 105a and 105b are formed on the dielectric film 103. The connection conductive portions 105a and 105b extend inside the dielectric-film openings 103a and 103b to be electrically connected to the portions of the electrode pattern 102.

Terminals 104a and 104b are formed on the upper surface of the dielectric film 103, and the terminals 104a and 104b are electrically connected to the connection conductive portions 105a and 105b, respectively.

The connection conductive portions 105a and 105b can be formed of an appropriate metal, such as Al or Cu, or an alloy. Similarly, the terminals 104a and 104b can be formed of an appropriate metal, such as Al or Cu, or an alloy.

As shown in FIG. 1, the electrode pattern 102 formed on the LiNbO$_3$ substrate 101 is formed of a thin gold film having a thickness of about 0.05$\lambda$, for example. Here, $\lambda$ is a wavelength corresponding to the center frequency of the boundary acoustic wave in a passband of the boundary acoustic wave filter device 100.

Additionally, $\phi$ and $\theta$ of the Euler angles of the LiNbO$_3$ substrate 101 are preferably set to be 0° and 105°, respectively. In FIG. 1, the number of electrode fingers of IDTs described below and the number of gratings of reflectors are smaller than the actual numbers for easy viewing.

The well-known right-handed Euler angles are used as the above-described Euler angles ($\phi$, $\theta$, $\psi$). That is, with reference to the crystal axes X, Y, and Z of a LiNbO$_3$ single crystal, the X-axis is rotated by $\phi$ in a counterclockwise direction about the Z-axis to obtain an Xa-axis. Next, the Z-axis is rotated by $\theta$ in a counterclockwise direction about the Xa-axis to obtain a Z'-axis. A plane which includes the Xa-axis and whose normal line is the Z'-axis is a cut surface of the substrate. The Xa-axis is rotated by $\psi$ in a counterclockwise direction about the Z'-axis to obtain a direction. This direction is the propagation direction of the boundary acoustic wave.

Regarding the crystal axes X, Y, and Z of the LiNbO$_3$ single crystal that are provided so as to correspond to the initial values of the Euler angles, the Z-axis is parallel to a c-axis. The X-axis is parallel to an arbitrary one of a-axes in three equivalent directions. The direction of the Y-axis is the normal line direction of the plane including the X-axis and Z-axis.

In FIG. 1, the crystal axis Z of the LiNbO$_3$ substrate 101 is rotated by 105° in a counterclockwise direction about the crystal axis X-axis to obtain a direction. This direction is the normal line direction of the surface of the sheet. Additionally, in FIG. 1, the direction in which the surface of the sheet extends left and right is the direction of the crystal axis X of the LiNbO$_3$ crystal substrate 101. Accordingly, in FIG. 1, the Euler angle of the boundary acoustic wave propagating in the left and right directions on the surface of the sheet is $\psi$=0°, and the Euler angle of the boundary acoustic wave propagating in the top and bottom directions on the surface of the sheet is ψ=90°.

The electrode pattern 102, as shown in FIG. 1, includes a longitudinally coupled resonator boundary acoustic wave filter 110, a one-terminal-pair boundary acoustic wave resonator 120 connected in series to the longitudinally coupled resonator boundary acoustic wave filter 110, and a one-terminal-pair boundary acoustic wave resonator 130 connected in parallel to the longitudinally coupled resonator boundary acoustic wave filter 110. The one-terminal-pair boundary acoustic wave resonator 120, which is connected in series to the boundary acoustic wave filter 110, is abbreviatedly referred to as a serially connected boundary acoustic wave resonator 120, and the one-terminal-pair boundary acoustic wave resonator 130, which is connected in parallel to the boundary acoustic wave filter 110, is abbreviatedly referred to as a parallel-connected boundary acoustic wave resonator 130.

The boundary acoustic wave filter 110 includes IDTs 113 to 115 disposed along the propagation direction of the boundary acoustic wave, and reflectors 111 and 112 each of which is disposed on a corresponding side of a region in which the IDTs 113 to 115 are provided, in the propagation direction of the boundary acoustic wave.

An end of the IDT 114 is electrically connected to the terminal 104a. Ends of the IDTs 113 and 115 are commonly connected and electrically connected through the serially connected boundary acoustic wave resonator 120 to the output terminal 104b. The parallel-connected boundary acoustic wave resonator 130 is connected between a portion at which the ends of the IDTs 113 and 115 are commonly connected, and the ground potential.

The electrode configuration shown in FIG. 1 is formed on a boundary between the $LiNbO_3$ substrate 101 and the $SiO_2$ film 103.

In the present preferred embodiment, the boundary acoustic wave filter device 100 is designed as a band-pass filter that selectively passes signals in a band of about 869 MHz to about 894 MHz. The boundary acoustic wave filter 110 is configured to have this passband. That is, the electrode-finger pitches, the number of pairs of the electrode fingers, and the cross widths of the IDTs 113 to 115, the electrode-finger pitches and the number of electrode fingers of the reflectors 111 and 112, the spaces among the IDTs, and the spaces between the IDTs and the reflectors are adjusted to design the boundary acoustic wave filter 110 such that the boundary acoustic wave filter 110 can selectively pass signals at about 869 MHz to about 894 MHz.

In contrast, the boundary acoustic wave resonator 120 is designed to have a resonance point at about 886 MHz in the passband of the boundary acoustic wave filter device 100 and to have an anti-resonance point at about 913 MHz in a stopband that is located in a higher frequency range than the passband of the boundary acoustic wave filter device 100. In the range of about 869 MHz to about 894 MHz, which is the passband of the boundary acoustic wave filter device 100, the boundary acoustic wave resonator 120 is designed such that the impedance of the boundary acoustic wave resonator 120 is equal to or less than approximately 40Ω.

Conversely, the boundary acoustic wave resonator 120 is designed such that the impedance of the boundary acoustic wave resonator 120 at about 913 MHz in the stopband of the boundary acoustic wave filter device 100 in the high frequency range is approximately 2000Ω. Accordingly, the boundary acoustic wave resonator 120 has a high impedance at frequencies in the vicinity of this frequency.

Furthermore, the boundary acoustic wave resonator 130 is designed to have a resonance point at about 972 MHz in the stopband that is located in a higher frequency range than the passband of the boundary acoustic wave filter device 100, and in the range of about 905 MHz to about 975 MHz, has a lower impedance than that of the boundary acoustic wave resonator 120. In contrast, in the passband from about 869 MHz to about 894 MHz, the boundary acoustic wave resonator 130 is designed such that the impedance of the boundary acoustic wave resonator 130 is equal to or more than approximately 150Ω. In this frequency range, the boundary acoustic wave resonator 130 is configured such that the impedance of the boundary acoustic wave resonator 130 is equal to or more than about 3.7 times that of the boundary acoustic wave resonator 120.

In the present preferred embodiment, the electrode configuration, as described above, preferably is configured using a thin gold film having a thickness of about 0.05λ, and the thickness of the $SiO_2$ film 103 is about 10 μm, for example.

Figure 3:
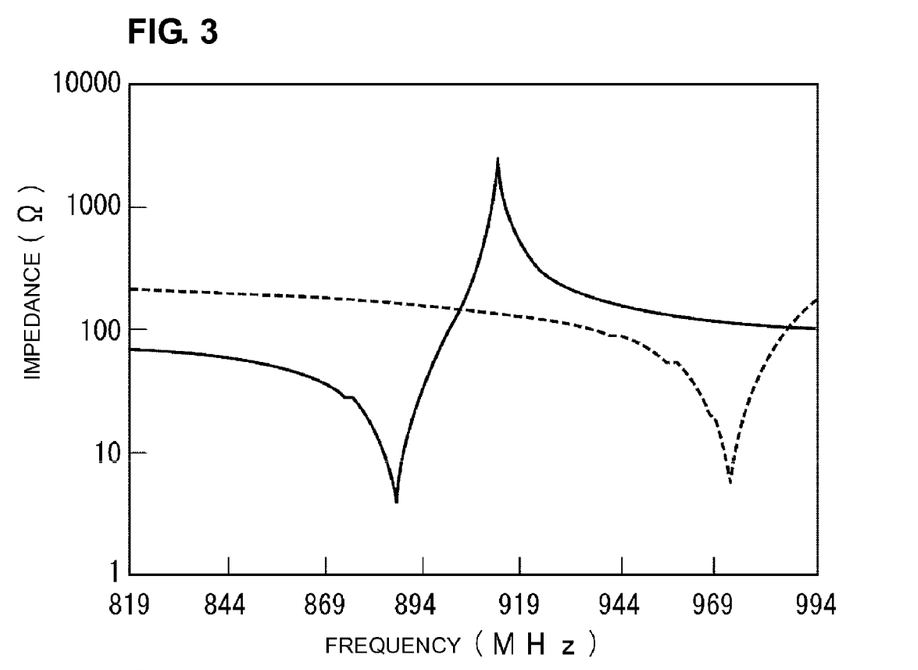
FIG. 3 is a graph showing the impedance characteristics of a parallel-connected boundary acoustic wave resonator and a serially connected boundary acoustic wave resonator used in the boundary acoustic wave filter device according to a preferred embodiment of the present invention.

FIG. 3 shows the impedance-versus-frequency characteristics of the boundary acoustic wave resonators 120 and 130. The solid line represents the impedance characteristics of the boundary acoustic wave resonator 120, and the broken line represents the impedance characteristics of the boundary acoustic wave resonator 130.

As clearly shown in FIG. 3, in the vicinity of about 913 MHz in the stopband of the boundary acoustic wave filter device 100 in the high frequency range, the boundary acoustic wave resonator 120 has a high impedance equal to or more than approximately 1000Ω. Accordingly, the serially connected boundary acoustic wave resonator 120 blocks signals in the vicinity of about 913 MHz, thereby increasing the attenuation of signals at frequencies in the vicinity of this frequency.

The impedance of the serially connected boundary acoustic wave resonator 120 in the passband from about 869 MHz to about 894 MHz is small, which is equal to or less than approximately 40Ω. Accordingly, the effect provided by connecting the boundary acoustic wave resonator 120 to the boundary acoustic wave filter 110 on the insertion loss in the passband is small.

In the stopband from about 905 MHz to about 975 MHz that is located in a higher frequency range than the passband of the boundary acoustic wave filter device 100, the parallel-connected boundary acoustic wave resonator 130 has a smaller impedance than that of the boundary acoustic wave resonator 120. That is, in the vicinity of about 905 MHz to about 975 MHz, the impedance of a signal path that runs through the parallel-connected boundary acoustic wave resonator 130 to the ground potential is smaller than the impedance of a signal path that runs through the serially connected boundary acoustic wave resonator 120 to the terminal 104b. Accordingly, in the range of about 905 MHz to about 975 MHz, most of the signal current flows through the parallel-connected boundary acoustic wave resonator 130 to the ground potential, thereby increasing the attenuation.

Conversely, the impedance of the parallel-connected boundary acoustic wave resonator 130 in the passband from about 869 MHz to about 894 MHz is equal to or more than about 3.7 times that of the serially connected boundary acoustic wave resonator 120. Accordingly, in the passband, the signal current flowing through the parallel-connected boundary acoustic wave resonator 130 to the ground potential is equal to or less than about 1/3.7 times that of flowing through the serially connected boundary acoustic wave resonator 120 to the output terminal 104b. That is, even though the parallel-connected boundary acoustic wave resonator 130 is connected to the boundary acoustic wave filter 110, the effect of the parallel-connected boundary acoustic wave resonator 130 on the insertion loss in the passband is small. Therefore, in the present preferred embodiment, the boundary acoustic wave resonator 130 can increase the attenuation in the stopband, which is in the vicinity of about 905 MHz to about 975 MHz, located in a higher frequency range than the passband without having a significant effect on the insertion loss in the passband.

Figure 4:
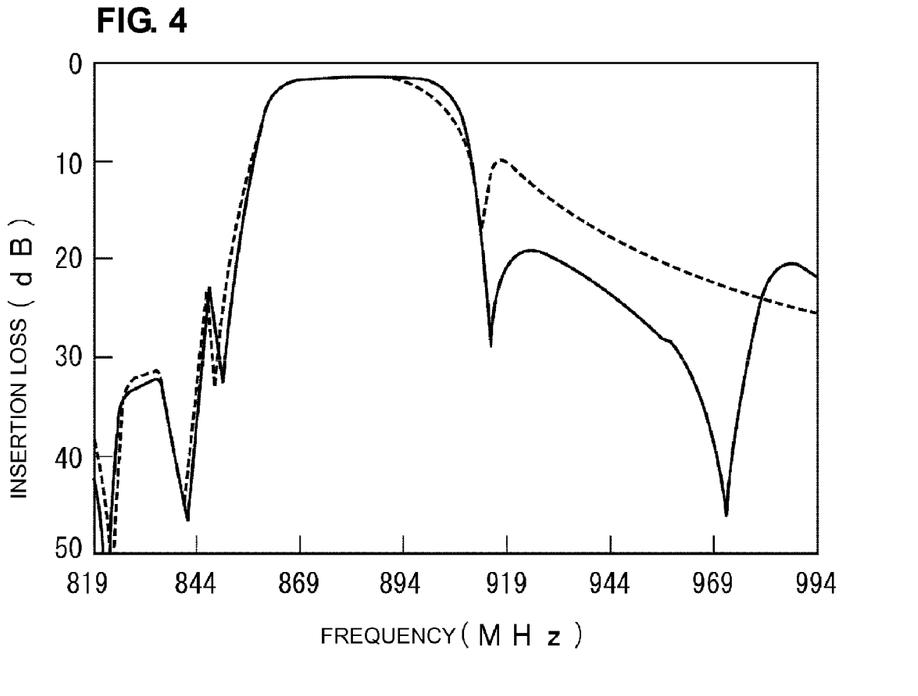
FIG. 4 is a graph showing the filter characteristics of the boundary acoustic wave filter device according to a preferred embodiment of the present invention and a boundary acoustic wave filter device according to a comparative example in the related art.

FIG. 4 is a graph showing the comparison between the filter characteristics of the boundary acoustic wave filter device according to the present preferred embodiment and the filter characteristics of a boundary acoustic wave filter device according to a comparative example in the related art. The solid line represents the filter characteristics of the boundary acoustic wave filter device according to the present preferred embodiment. The broken line represents the filter characteristics of the boundary acoustic wave device having the same configuration as that of the boundary acoustic wave filter device according to the present preferred embodiment except that the boundary acoustic wave resonator 130 is not connected to the boundary acoustic wave filter.

As clearly shown in FIG. 4, according to the present preferred embodiment, by connecting the parallel-connected boundary acoustic wave resonator 130 to the boundary acoustic wave filter, the attenuation in the high frequency range located outside of the passband can be markedly improved.

That is, in the vicinity of about 972 MHz at which the resonance point of the boundary acoustic wave resonator 130 is located, the impedance of the boundary acoustic wave resonator 130 markedly decreases, whereby a large amount of signal current flows to the ground potential. This enables the attenuation to be increased at frequencies in the vicinity of the frequency corresponding to the resonance point of the one-terminal-pair boundary acoustic wave resonator 130.

As described above, even though the boundary acoustic wave resonator 130 is connected to the boundary acoustic wave filter 110, the effect of the boundary acoustic wave resonator 130 on the passband is small. A capacitive impedance, i.e., an impedance with a negative imaginary part, which the boundary acoustic wave resonator 130 has, allows the terminal impedance of the boundary acoustic wave filter device 100 to be capacitive. Because the boundary acoustic wave filter 110 has a comparatively large electromechanical coefficient, this allows the terminal impedance of the boundary acoustic wave filter 110 in the passband of the filter device to be inductive. Furthermore, in the present preferred embodiment, the longitudinally coupled resonator boundary acoustic wave filter 110, which uses the SH-type boundary acoustic wave propagating along the boundary between the LiNbO₃ substrate 101 with the Euler angles of φ=0° and θ=105° and the SiO₂ film 103, is preferably used. Because in this type of boundary acoustic wave filter, the electromechanical coefficient K2 can be increased to about 16%, the boundary acoustic wave filter can be designed such that the terminal impedance of the longitudinally coupled resonator filter 110 is further inductive.

In the present preferred embodiment, by designing the terminal impedance of the longitudinally coupled resonator boundary acoustic wave filter 110 to be inductive and by adding the capacitive impedance which the parallel-connected boundary acoustic wave resonator has to the longitudinally coupled resonator boundary acoustic wave filter 110, the terminal impedance of the boundary acoustic wave filter device 100 can be prevented from becoming too capacitive.

In the present preferred embodiment, one serially connected boundary acoustic wave resonator and one parallel-connected boundary acoustic wave resonator are connected to one longitudinally coupled resonator boundary acoustic wave filter. However, according to the present invention, a plurality of longitudinally coupled resonator boundary acoustic wave filters may be provided. That is, for example, a plurality of longitudinally coupled resonator boundary acoustic wave filters may be cascade-connected.

Furthermore, two or more serially connected boundary acoustic wave resonators, or two or more parallel-connected boundary acoustic wave resonators can be provided.

Although in the present preferred embodiment, as shown in FIG. 1, wiring patterns for connecting the longitudinally coupled resonator boundary acoustic wave filter 110 to the boundary acoustic wave resonators 120 and 130, and wiring patterns of the connections to the ground potential are schematically shown, these wiring patterns can be configured using approximate conductive paths. As these wiring patterns, electrical patterns other than conductive paths can be used. Impedance elements whose impedance is larger than that of a boundary acoustic wave resonator in the passband and whose impedance at an anti-resonance point of the boundary acoustic wave resonator is smaller than that of a boundary acoustic wave resonator can be also used as these wiring patterns.

In a case where a LiNbO₃ substrate is used, when φ and θ of the Euler angles are provided in a range of $-31°\leq\phi\leq 31°$ and in a range of $90°\leq\theta\leq 130°$, respectively, regarding a boundary acoustic wave propagating along a boundary between the LiNbO₃ substrate and a dielectric film overlying thereof, by varying ψ of the Euler angles, which indicates the propagation direction of the boundary acoustic wave, in a range of 0° to 60°, the electromechanical coefficient $K^2$ can be varied in a range of about 16% to substantially 0%. Furthermore, in this range, the propagation loss of the boundary acoustic wave is not produced. Accordingly, preferably, by setting φ and θ of the LiNbO₃ substrate in the above-described range, a boundary acoustic wave filter device with low loss can be provided.

In the present preferred embodiment, the SiO₂ film is used as a dielectric film. However, SiN, crystal, LBO, langasite, langanite, or glass can be used instead of the SiO₂ film. When a dielectric film is formed of these dielectric materials, a boundary acoustic wave filter with excellent temperature characteristics can be obtained in accordance with various preferred embodiments of the present invention.

The IDTs, as described above, are preferably formed of Al. However, a metal other than Al, such as Ti, Pt, Fe, Ni, Cr, Cu, Ag, W, Ta, or Au, can be used. An alloy mainly including these metals can also be used. The use of these metals or an alloy mainly including these metals allows the propagation loss of a boundary acoustic wave to be reduced, which is desirable.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. A boundary acoustic wave filter device comprising:
a piezoelectric substrate;
a dielectric film disposed on the piezoelectric substrate;
at least one longitudinally coupled resonator boundary acoustic wave filter including a plurality of IDTs disposed along a boundary between the piezoelectric substrate and the dielectric film; and at least two one-terminal-pair boundary acoustic wave resonators each having an IDT located at the boundary between the piezoelectric substrate and the dielectric film; wherein at least one of the at least two one-terminal-pair boundary acoustic wave resonators defines a serially connected boundary acoustic wave resonator connected in series to the longitudinally coupled resonator boundary acoustic wave filter;

at least another of the at least two one-terminal-pair boundary acoustic wave resonators defines a parallel-connected boundary acoustic wave resonator connected in parallel to the longitudinally coupled resonator boundary acoustic wave filter;

an anti-resonant frequency of the serially connected boundary acoustic wave resonator is located in a higher frequency range than a passband of the longitudinally coupled resonator boundary acoustic wave filter;

a resonant frequency of the parallel-connected boundary acoustic wave resonator is equal to or higher than the anti-resonant frequency of the serially connected boundary acoustic wave resonator;

the piezoelectric substrate is a single-crystal-$LiNbO_3$ substrate, and $\phi$ and $\theta$ of the Euler angles of the piezoelectric substrate are in a range of $-31°\leqq\phi\leqq31°$ and in a range of $90°\leqq\theta\leqq130°$, respectively; and a terminal impedance of the at least one longitudinally coupled resonator boundary acoustic wave filter in the passband is inductive.

2. The boundary acoustic wave filter device according to claim 1, wherein the IDTs are composed of one type of metal selected from a group of Al, Ti, Pt, Fe, Ni, Cr, Cu, Ag, W, Ta, and Au, or an alloy mainly including the metal.

3. The boundary acoustic wave filter device according to claim 1, wherein the dielectric film is composed of one type of material selected from a group of $SiO_2$, SiN, crystal, LBO, langasite, langanite, and glass.

* * * * *